United States Patent
Kwon et al.

(10) Patent No.: US 8,111,559 B2
(45) Date of Patent: Feb. 7, 2012

(54) NON-VOLATILE RANDOM ACCESS MEMORY WITH A CONTROL CIRCUIT FOR PREVENTING AN INITIAL RESISTANCE FAILURE, A SOLID STATE DRIVE, AND A COMPUTER SYSTEM INCLUDING THE SAME

(75) Inventors: Min Cheol Kwon, Seoul (KR); Dong Jun Shin, Hwasung-si (KR); Sun-Mi Yoo, Seoul (KR); Jong-Chul Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 114 days.

(21) Appl. No.: 12/662,221

(22) Filed: Apr. 6, 2010

(65) Prior Publication Data
US 2010/0259998 A1 Oct. 14, 2010

(30) Foreign Application Priority Data

Apr. 9, 2009 (KR) ........................ 10-2009-0030672

(51) Int. Cl.
G11C 7/10 (2006.01)
(52) U.S. Cl. .............. 365/189.05; 365/189.15; 365/148; 365/163; 365/211; 365/185.02

(58) Field of Classification Search .................. 365/148, 365/163, 189.15, 189.16, 189.05, 211, 185.02
See application file for complete search history.

(56) References Cited

U.S. PATENT DOCUMENTS

| 7,259,982 | B2 * | 8/2007 | Johnson ........................ 365/163 |
| 7,315,469 | B2 | 1/2008 | Choi |
| 7,859,894 | B2 * | 12/2010 | Happ et al. .................... 365/163 |
| 2004/0225829 | A1 | 11/2004 | Akiyama |
| 2007/0255891 | A1 | 11/2007 | Chow |

FOREIGN PATENT DOCUMENTS

| JP | 2004-334996 | 11/2004 |
| JP | 2005-346900 | 12/2005 |
| KR | 10-2004-0095619 | 11/2004 |
| KR | 10-0618824 | 8/2006 |

* cited by examiner

*Primary Examiner* — Andrew Q Tran
(74) *Attorney, Agent, or Firm* — Harness, Dickey & Pierce, P.L.C.

(57) ABSTRACT

The non-volatile random access memory (RAM) includes a non-volatile RAM array, a buffer configured to buffer data to be programmed in the non-volatile RAM array and configured to buffer data read from the non-volatile RAM array, and a control block configured to read data from at least one of the non-volatile RAM array and the buffer based on whether the data to be read has been stored in the buffer, a temperature when the data was programmed, and a time lapse since the programming of the data.

20 Claims, 7 Drawing Sheets

NON-VOLATILE RANDOM ACCESS MEMORY WITH A CONTROL CIRCUIT FOR PREVENTING AN INITIAL RESISTANCE FAILURE, A SOLID STATE DRIVE, AND A COMPUTER SYSTEM INCLUDING THE SAME

CROSS-REFERENCE TO RELATED APPLICATION

This application claims priority under 35 U.S.C. §119(e) to Korean Patent Application No. 10-2009-0030672 filed on Apr. 9, 2009, in the Korean Intellectual Property Office, the disclosure of which is incorporated herein in its entirety by reference.

BACKGROUND

1. Field

Example embodiments of inventive concepts relate to a non-volatile random access memory (RAM), for example, to a non-volatile RAM for reading data, from a buffer included therein or reading data from a non-volatile memory array included therein, based on temperature during a program operation and a time lapse since the program operation when performing a read operation, and a solid state drive (SSD) and a computer system including the same.

2. Description of the Related Art

SSDs used as main storage devices instead of hard disk drives (HDDs) include flash memory for storing data. For flash memory, since an overwrite operation is not permitted, block erasing and a merge operation are performed during a program operation. In addition, the number of available program operations is limited per block in the flash memory, and therefore, it is important to keep the wear of blocks uniform using a scheme like wear leveling. To overcome the problems caused by these characteristics of flash memory, non-volatile RAM is utilized as cache memory for data requiring frequent updates.

With developments in semiconductor technology, studies have been performed on non-volatile RAM that can operate at a higher speed like dynamic RAM (DRAM) but can retain data even when not powered like flash memory. Examples of such non-volatile RAM include phase-change RAM (PRAM), ferroelectric RAM (FRAM), and magnetic RAM (MRAM).

PRAM is a memory device which stores data in a cell by determining "high" or "low" logic based on resistance changing according to a phase state changing based on current of the cell. When data is read from PRAM before a certain period of time since a cell is programmed at a relatively hot temperature, errors are more highly likely to occur. Such characteristics of PRAM are referred to as an initial resistance fail. The initial resistance fail of PRAM is generally influenced by external temperature. Therefore, to prevent or reduce the initial resistance fail, it is generally necessary to monitor and manage a time when data is programmed in a cell and external temperature thereafter.

SUMMARY

Example embodiments of inventive concepts provide a non-volatile random access memory (RAM) configured to prevent or reduce the likelihood of an initial resistance fail by monitoring a data program time and a subsequent external temperature and reading data based on the monitored result, and a solid state drive (SSD) and a computer system including the same.

According to example embodiments of inventive concepts, a non-volatile RAM includes a non-volatile RAM array, a buffer, and a control block. The buffer is configured to buffer data to be programmed in the non-volatile RAM array and is configured to buffer data read from the non-volatile RAM array. The control block is configured to read data from at least one of the non-volatile RAM array and the buffer based on whether the data to be read has been stored in the buffer, a temperature when the data was programmed, and a time lapse since the programming of the data.

In example embodiments of inventive concepts, the non-volatile RAM array is a phase-change random access memory (PRAM) array.

In example embodiments of inventive concepts, the buffer is one of static random access memory (SRAM) and dynamic random access memory (DRAM).

In example embodiments of inventive concepts, the control block is configured to read the data from the buffer when the data is stored in both the buffer and the non-volatile RAM array.

In example embodiments of inventive concepts, the control block is configured to read the data from the non-volatile RAM array based on whether a threshold time period corresponding to the temperature at the programming of the data has lapsed, when the data is stored in the non-volatile RAM array only.

In example embodiments of inventive concepts, the control block is configured to defer executing a read command until the threshold time period lapses, when the data is stored in the non-volatile RAM array only.

In example embodiments of inventive concepts, the control block is configured to read the data from the non-volatile RAM array after the threshold time period lapses, when the data is stored in the non-volatile RAM array only.

In example embodiments of inventive concepts, the control block further includes a cell information storage unit, a time table, a controller. The cell information storage unit is configured to store program information relating to position information of programmed data, a temperature when the data was programmed, and a time when the data was programmed. The time table is configured to store a threshold time period for execution of a read command, which corresponds to the temperature when the data was programmed. The controller is configured to execute the read command based on the program information and whether the threshold time period has lapsed.

In example embodiments of inventive concepts, the control block further includes a timer configured to count time since the data is programmed and a temperature sensor configured to measure the temperature when the data is programmed.

According to example embodiments of inventive concepts, a solid state drive (SSD) includes a non-volatile memory array and the non-volatile random access memory (RAM) configured to function as a cache memory for data fetched from the non-volatile memory array.

According to example embodiments of inventive concepts, a computer system includes the non-volatile RAM configured to function as at least one of a buffer and a storage device.

BRIEF DESCRIPTION OF THE DRAWINGS

The above and other features and advantages of inventive concepts will become more apparent by describing in detail example embodiments thereof with reference to the attached drawings in which.

DETAILED DESCRIPTION

Figure 1:
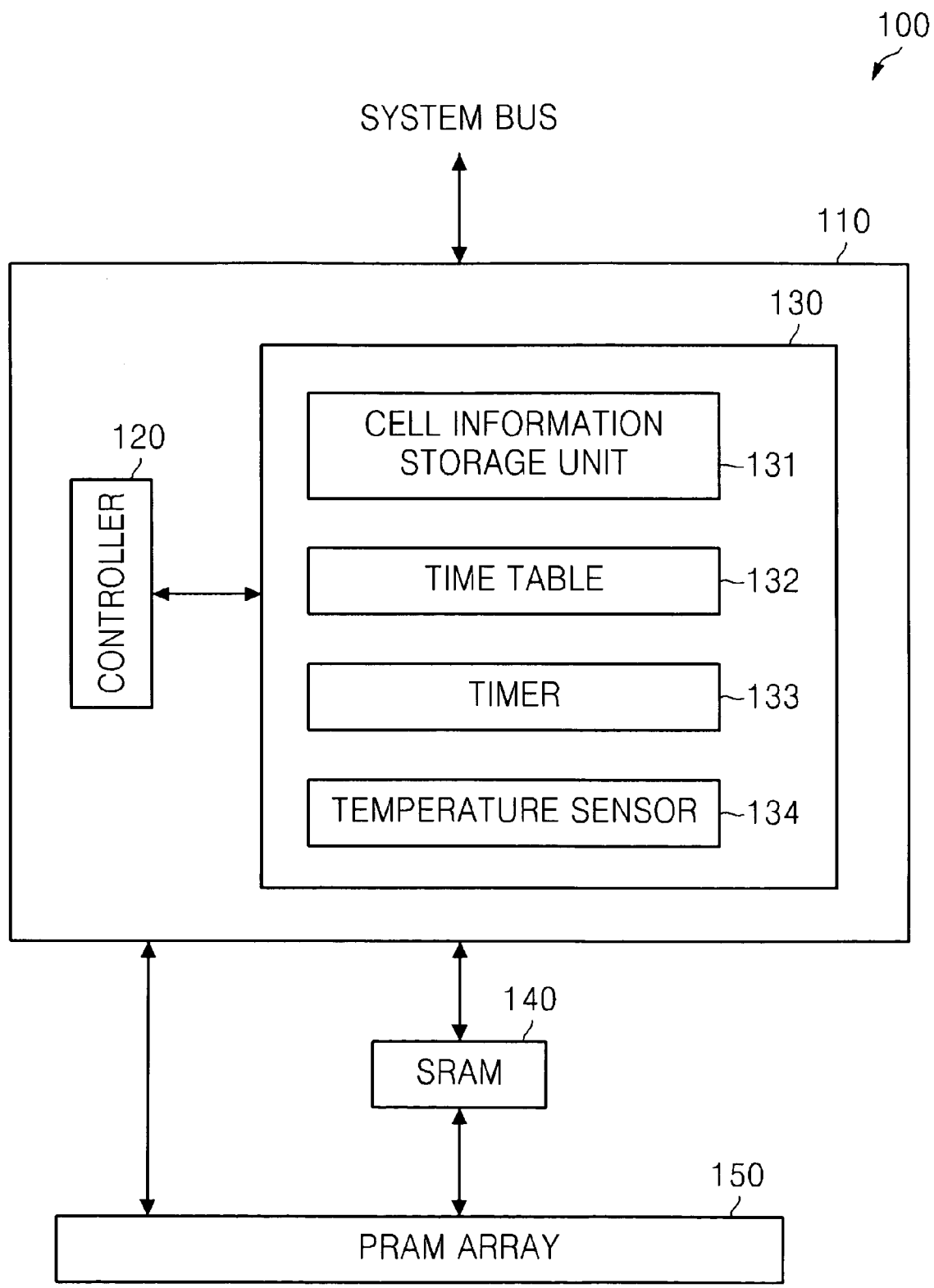
FIG. 1 is a block diagram of a non-volatile random access memory (RAM) according to example embodiments of inventive concepts.

Example embodiments of inventive concepts now will be described more fully hereinafter with reference to the accompanying drawings, in which example embodiments of inventive concepts are shown. Example embodiments of inventive concepts may, however, be embodied in many different forms and should not be construed as limited to the embodiments set forth herein. Rather, these embodiments are provided so that this disclosure will be thorough and complete, and will fully convey the scope of inventive concepts to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures. The figures are intended to depict example embodiments and should not be interpreted to limit the intended scope of the claims. The accompanying figures are not to be considered as drawn to scale unless explicitly noted.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

When it is determined that a detailed description related to a related known function or configuration may make the purpose of example embodiments unnecessarily ambiguous, the detailed description thereof will be omitted. Also, terms used herein are defined to appropriately describe example embodiments and thus may be changed depending on a user, the intent of an operator, or a custom. Accordingly, the terms must be defined based on the following overall description within this specification.

FIG. 1 is a block diagram of a non-volatile random access memory (RAM) 100 according to example embodiments of inventive concepts. The non-volatile RAM 100 includes a control block 110, a buffer 140, and a non-volatile RAM array 150.

The control block 110 controls the overall operations such as data programming and data reading of the non-volatile RAM 100. For example, the control block 110 reads data from the non-volatile RAM array 150 or the buffer 140 based on whether data to be read has been stored in the buffer 140, temperature when the data was programmed, and a time lapse since the programming of the data. The data read from the non-volatile RAM 100 may be output through a system bus of a computer system including the non-volatile RAM 100.

The buffer 140 buffers data to be programmed in the non-volatile RAM array 150 or data read from the non-volatile RAM array 150. The buffer 140 may be implemented by static RAM (SRAM) or dynamic RAM (DRAM), but example embodiments of inventive concepts are not restricted thereto.

The non-volatile RAM array 150 includes a plurality of cells for storing data. The non-volatile RAM array 150 is a next generation memory semiconductor that has advantages of high capacity and non-volatility like flash memory and an advantage of high speed like RAM. The non-volatile RAM array 150 may, for example, include a PRAM (Phase-change Random Access Memory) array, FRAM (Ferroelectric Random Access Memory) array, or MRAM (Magnetic Random Access Memory) array, but example embodiments of inventive concepts are not limited thereto.

When data to be read has been stored in both the buffer 140 and the non-volatile RAM array 150, the control block 110 may read the data from the buffer 140. The buffer 140 temporarily stores an amount of data to be programmed to the non-volatile RAM array 150. If data to be read has been stored in the buffer 140, the control block 110 reads the data not from the non-volatile RAM array 150 but from the buffer 140.

When data to be read has not been stored in the buffer 140 but has been stored in the non-volatile RAM array 150 only, the control block 110 reads the data from the non-volatile RAM array 150 based on whether a threshold time corresponding to temperature when the data was programmed has lapsed. The threshold time is set to secure the accuracy of data read during a read operation and may vary with temperature during programming of the data.

The operation of the control block 110 when data to be read has been stored in the non-volatile RAM array 150 only will be described in more detail. When the threshold time has not lapsed since programming of the data, the control block 110 defers executing a read command and carries out the read command after the threshold time lapses. Data read from the non-volatile RAM array 150 before the threshold time lapses may not be accurate. After the threshold time lapses, the control block 110 reads data from the non-volatile RAM array 150 because the accuracy of data read from the non-volatile RAM array 150 is generally secured.

Figure 2:
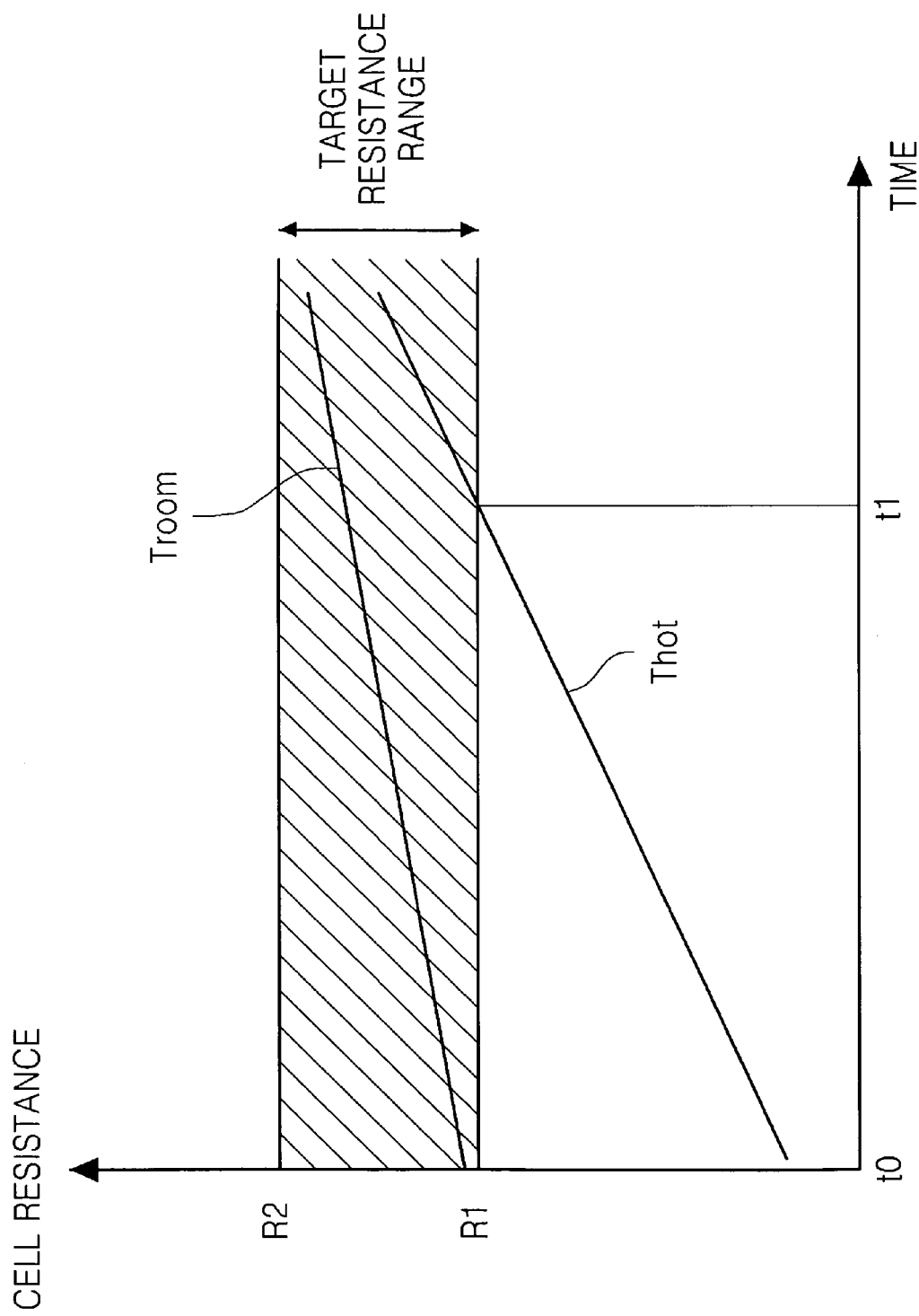
FIG. 2 is a graph illustrating a resistance characteristic with respect to cell temperature in the non-volatile RAM illustrated in FIG. 1.

FIG. 2 is a graph illustrating a resistance characteristic with respect to cell temperature in the non-volatile RAM array 150 illustrated in FIG. 1. For example, the graph shows the characteristic of a PRAM cell included in the non-volatile RAM array 150, which is a PRAM array having a threshold time according to a temperature.

Referring to FIG. 2, a PRAM cell programmed at a room temperature Troom has a resistance within a target resistance range from R1 to R2 in which data can be read accurately from a time (hereinafter referred to as a "data program time") when the data is programmed. A PRAM cell programmed at a hot temperature Thot has a resistance within the target resistance range after a time t1 reached when the threshold time lapses since the data program time t0. This means that the PRAM cell programmed at the room temperature Troom can be accurately read from the data program time t0 while the PRAM cell programmed at the hot temperature Thot can be accurately read only after the threshold time lapses since the data program time t0. Data read from the PRAM cell programmed at the hot temperature Thot at a time instant between t0 and t1 before the threshold time lapses is likely inaccurate. An error occurring because data is read from PRAM during a time period between the data program time t0 and the time t1 before the threshold time lapses may be referred to as an initial resistance fail.

According to example embodiments of inventive concepts, when reading data from the non-volatile RAM array 150, the non-volatile RAM 100 reads the data from a non-volatile RAM cell after a threshold time for the cell lapses since data programming, thereby preventing or reducing the likelihood of the initial resistance fail that may occur in PRAM.

Referring back to FIG. 1, the control block 110 includes a controller 120 and a monitoring block 130. The controller 120 controls a program operation and a read operation. The monitoring block 130 stores and/or generates information based on whether the controller 120 is controlling the program and/or read operations. The monitoring block includes a cell information storage unit 131, a time table 132, a timer 133, and a temperature sensor 134.

The cell information storage unit 131 may store program information including position information of programmed data, a temperature when the data is programmed (hereinafter referred to as a "data program temperature"), and a data program time. The position information of programmed data or data to be read (hereinafter referred to as "data position information") may include an address of the buffer 140 and/or an address of the non-volatile RAM array 150 where the data has been stored. The controller 120 determines whether a position of data to be read is from the buffer 140 or the non-volatile RAM array 150 based on the data position information.

The time table 132 stores a threshold time for the execution of a read command, which corresponds to a data program temperature with respect to a read command. The threshold time indicates a period of time from a data program time to a time at which accurate data reading is likely. Whether the threshold time has lapsed is information which the control block 110 uses to determine whether to defer executing the read command. The threshold time may be determined based on a temperature when the data is programmed.

Whether the threshold time has lapsed is determined based on the threshold time stored in the time table 132 and a time counted by the timer 133 from the data program time. The data program temperature is measured by the temperature sensor 134. The temperature sensor 134 is included in the monitoring block 130, but example embodiments of inventive concepts are not restricted thereto. For example, the temperature may be measured by a sensing element outside the monitoring block 130 and then provided to the controller 120.

The controller 120 executes a read command based on the program information stored in the cell information storage unit 131 and whether a threshold time corresponding to a data program temperature has lapsed.

Figure 3:
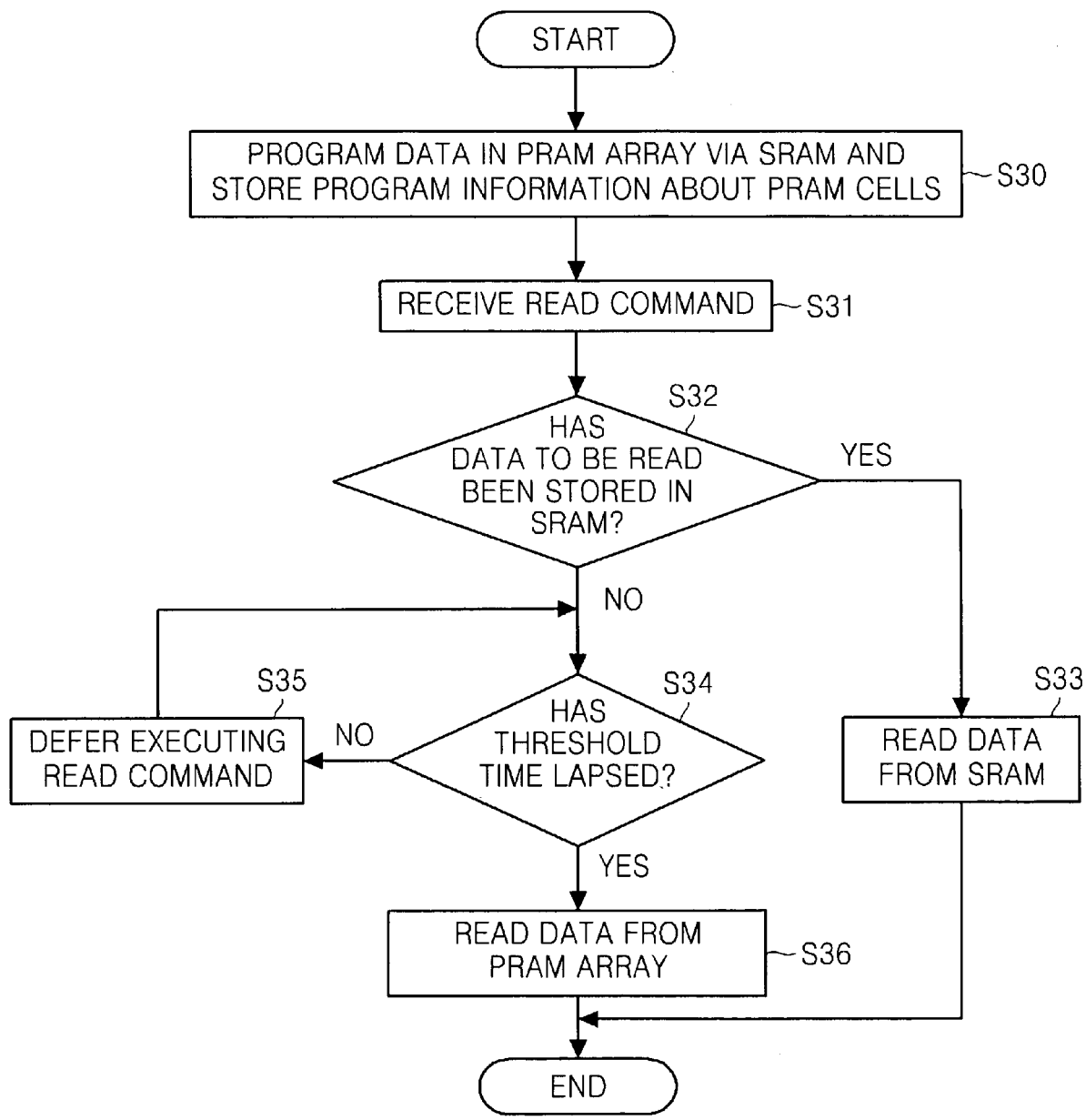
FIG. 3 is a flowchart of an operation method of a non-volatile RAM according to example embodiments of inventive concepts.

FIG. 3 is a flowchart of an operation method of the non-volatile RAM 100 according to example embodiments of inventive concepts. The operation method will be sequentially described with reference to FIGS. 1 and 3.

In response to a program command, the control block 110 of the PRAM 100 programs data in the PRAM array 150 via the SRAM 140 and stores information about programmed cells at step S30. As described above with reference to FIG. 1, the information about the programmed cells may include data position information, a data program temperature, and a data program time.

Thereafter, when the PRAM 100 receives a read command at step S31, the control block 110 of the PRAM 100 determines whether data to be read has been stored in the SRAM 140 based on the data position information in operation S32. When it is determined that the data to be read has been stored in the SRAM 140, the control block 110 reads the data from the SRAM 140 and outputs it to the system bus at step S33.

When it is determined that the data to be read has not been stored in the SRAM 140, for example, the data has been stored in the PRAM array 150 only, the control block 110 determines whether a threshold time for programmed cells has lapsed based on a threshold time corresponding to a data program temperature and a time counted by the timer 133 at step S34. When it is determined that the threshold time has not lapsed, the control block 110 defers executing the read command at step S35. When it is determined that the threshold time has lapsed, the control block 110 reads and outputs the data from the PRAM array 150 at step S36. When the execution of the read command is deferred, the control block 110 periodically checks whether the threshold time has lapsed and reads data from the PRAM array 150 only after the threshold time lapses.

Figure 4:
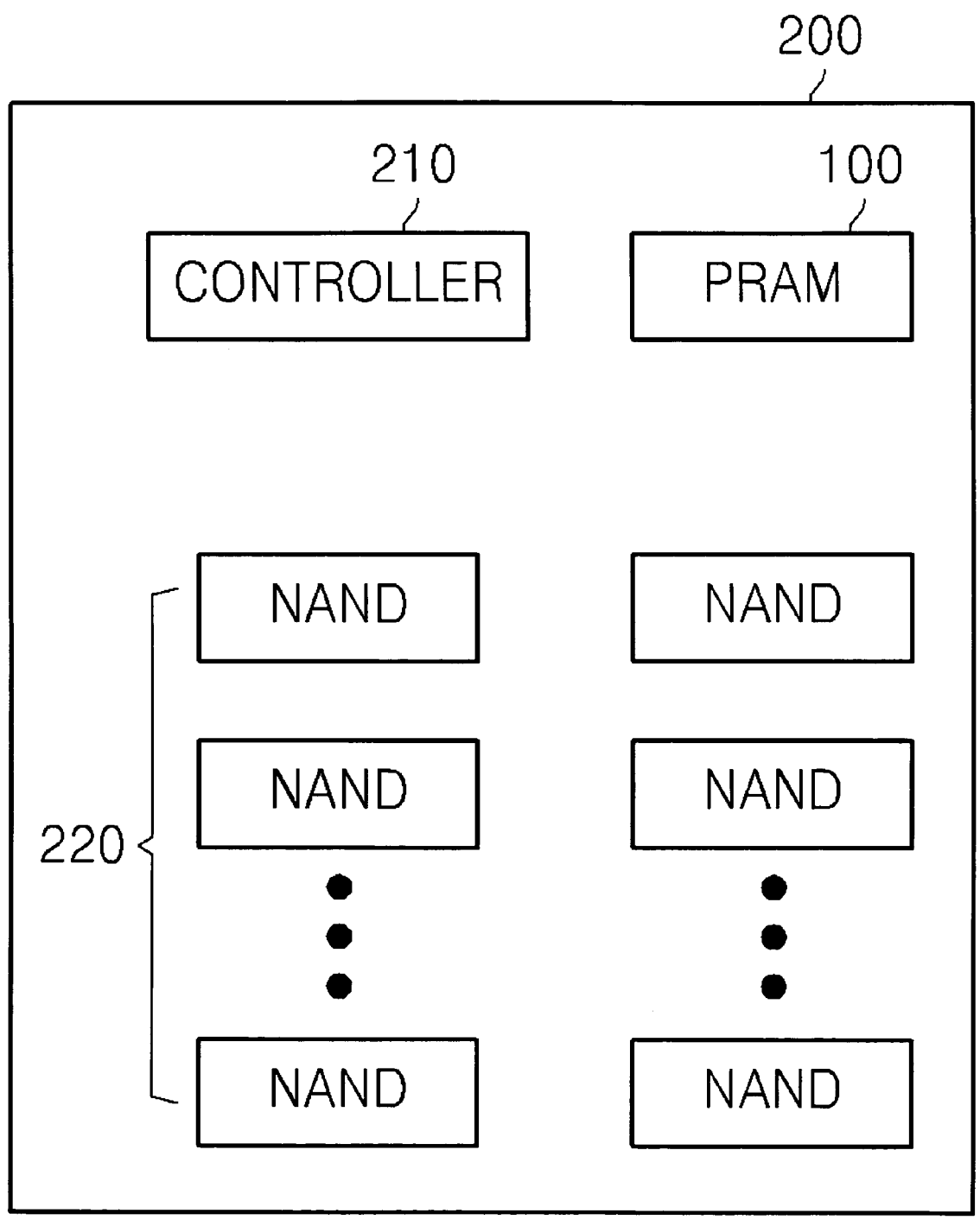
FIG. 4 is a block diagram of a solid state drive (SSD) according to example embodiments of inventive concepts.

FIG. 4 is a block diagram of a solid state drive (SSD) 200 according to example embodiments of inventive concepts. Referring to FIG. 4, the SSD 200 includes a controller 210, the non-volatile RAM 100, and a non-volatile memory array

220. The non-volatile RAM 100 is implemented by PRAM and the non-volatile memory array 220 is implemented by a NAND flash memory array, but example embodiments of inventive concepts are not restricted to thereto.

The control block 210 controls the operation of the SSD 200. The non-volatile memory array 220 stores an operating system (OS), a variety of programs, and a variety of data. When electric power is supplied to a system including the SSD 200, the OS stored in the non-volatile memory array 220 may be uploaded to the non-volatile RAM 100 and the system may perform a boot operation based on the uploaded OS. At this time, the non-volatile RAM 100 functions as a main memory of the system. Among data stored in the non-volatile memory array 220, frequently updated data or frequently read data may also be uploaded to the non-volatile RAM 100. The frequently updated or read data may, for example, include meta data or hot data, but example embodiments of inventive concepts are not restricted thereto.

Data updating or reading may be performed through the non-volatile RAM 100. At this time, the non-volatile RAM 100 functions as a cache memory in the SSD 200. When the data updating or reading is performed through the non-volatile RAM 100 instead of the non-volatile memory array 220, the life of the non-volatile memory array 220 may be prolonged and data input/output performance may be increased.

As described above, the non-volatile RAM 100, e.g., the PRAM 100 functions as a cache memory for the non-volatile memory array 220, e.g., the NAND flash memory array, thereby increasing the program performance of the NAND flash memory array, prolonging the life of the NAND flash memory array, and increasing the data input/output performance of the SSD 200.

Figure 5:
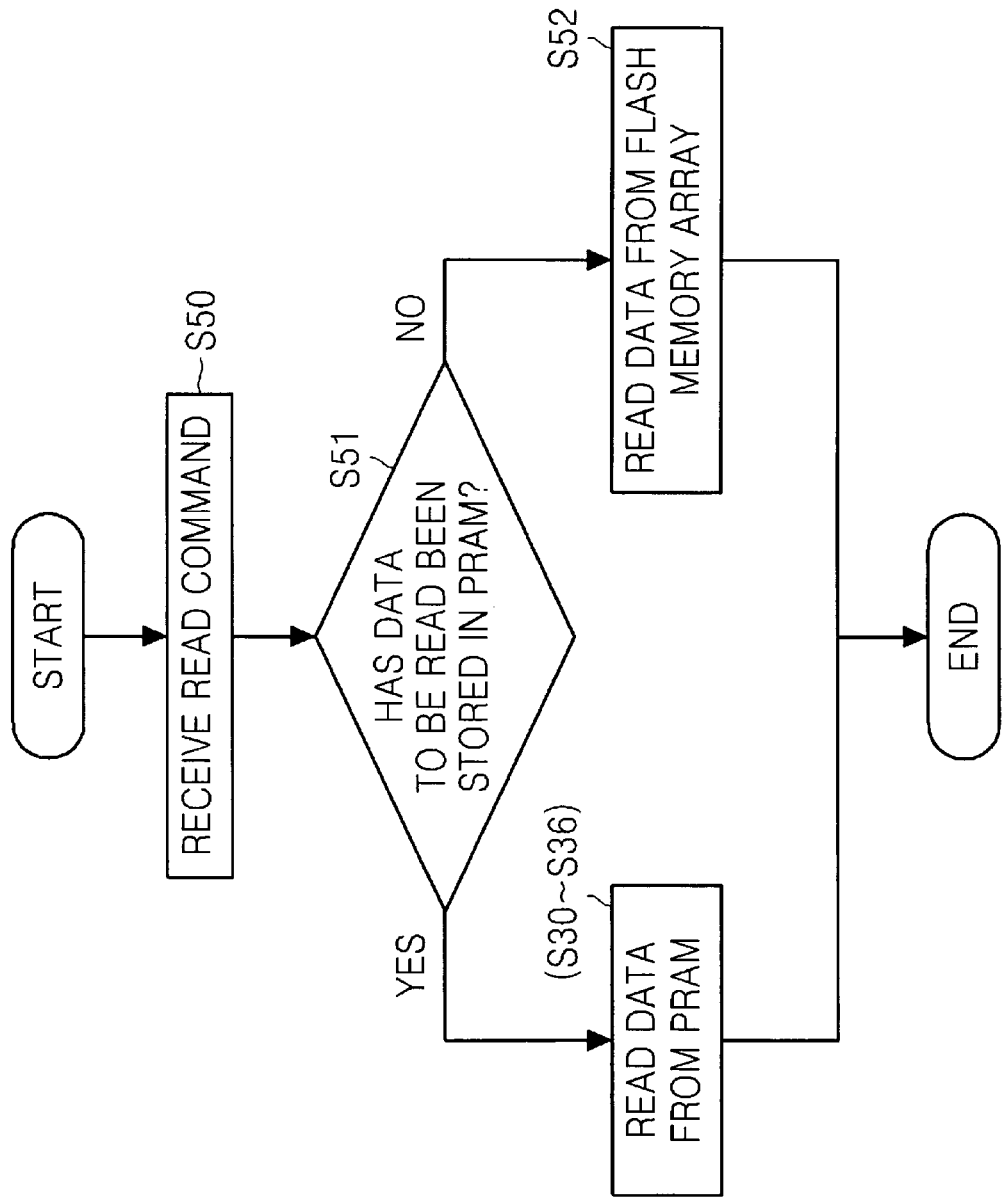
FIG. 5 is a flowchart of an operation method of an SSD according to example embodiments of inventive concepts.

FIG. 5 is a flowchart of an operation method of the SSD 200 according to example embodiments of inventive concepts. The operation method will be described sequentially with reference to FIG. 1 and FIGS. 3 through 5.

When the SSD 200 receives a read command at step S50, the controller 210 determines whether data to be read has been stored in the PRAM 100 at step S51. When it is determined that the data to be read has been stored in the PRAM 100, the controller 210 reads the data from the PRAM 100 at steps S30 through S36. The reading of the data from the PRAM 100 has been described with reference to FIG. 3. Thus, detailed descriptions thereof will be omitted.

When it is determined that the data to be read has not been stored in the PRAM 100, for example, the data has been stored in the NAND flash memory array 220, the controller 210 reads the data from the NAND flash memory array 220 at step S52.

The non-volatile RAM 100 and/or the SSD 200 according to example embodiments of inventive concepts may be packed in various types of packages. For example, the various packages may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP).

Example embodiments of inventive concepts may be embodied in hardware, software, firmware or combination thereof. When the operation method of a non-volatile RAM according to example embodiments of inventive concepts or the operation method of an SSD according to example embodiments of inventive concepts are embodied in software, it can be embodied as computer readable codes or programs on a computer readable recording medium. The computer readable recording medium is any data storage device that can store data which can be thereafter read by a computer system. Examples of the computer readable recording medium may includes read-only memory (ROM), random-access memory (RAM), electrically erasable programmable ROM (EEPROM), and flash memory.

Figure 6:
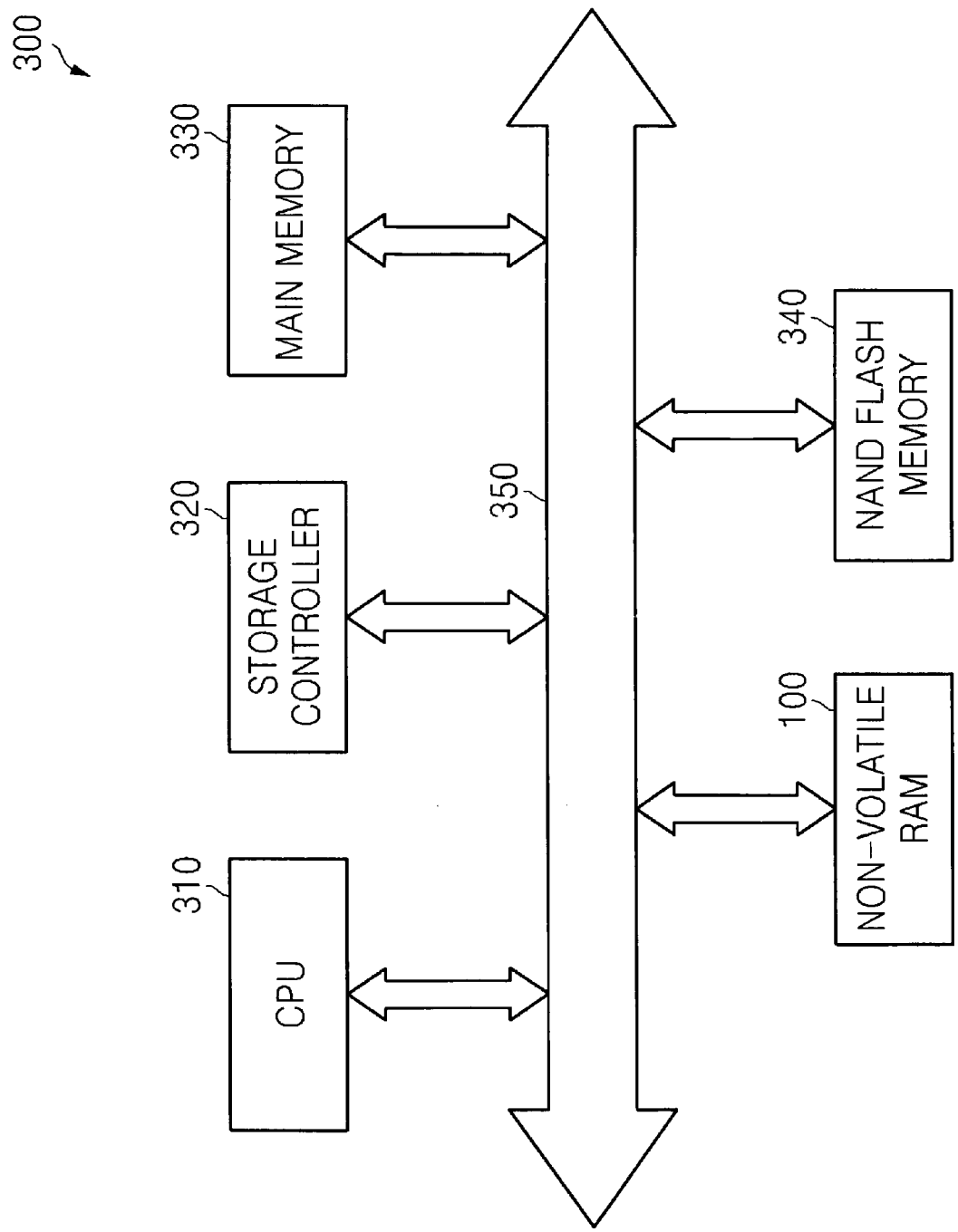
FIG. 6 is a block diagram of a computer system according to example embodiments of inventive concepts.

FIG. 6 is a block diagram of a computer system 300 according to example embodiments of present inventive concepts. The computer system 300 may be a personal computer (PC) or a notebook computer that uses as a main storage device an SSD instead of an HDD, but example embodiments of inventive concepts are not restricted thereto. For example, a computer system 300 according to example embodiments of inventive concepts may include a PDA (personal digital assistance), cellular telephone, MP3 player, PMP (portable multimedia player), automotive navigation system, and MID (Mobile Internet Device) etc The computer system 300 includes a central processing unit (CPU) 310, a storage controller 320, a main memory 330, a non-volatile memory 340, and the non-volatile RAM 100. These elements of the computer system 300 are connected to one another through a system bus 350.

The CPU 310 performs a variety of computations necessary to drive the computer system 300. The storage controller 320 controls storage devices such as the non-volatile memory 340 which may be implemented by a NAND flash memory as a main storage device, the main memory 330 which may be implemented by a DRAM, and the non-volatile RAM 100 which may function as a cache memory or a buffer for the non-volatile memory 340.

In FIG. 6, an SSD may be implemented by elements scattered throughout the computer system 300. For instance, controllers that respectively control the non-volatile memory 340 and the non-volatile RAM 100 may be included in the storage controller 320 and the SSD may be implemented by a combination of the controllers included in the storage controller 320, the non-volatile memory 340, and the non-volatile RAM 100. The structure, the functions, and the effects of the SSD are similar to those described with reference to FIGS. 4 and 5. Thus, detailed descriptions thereof will be omitted.

Figure 7:
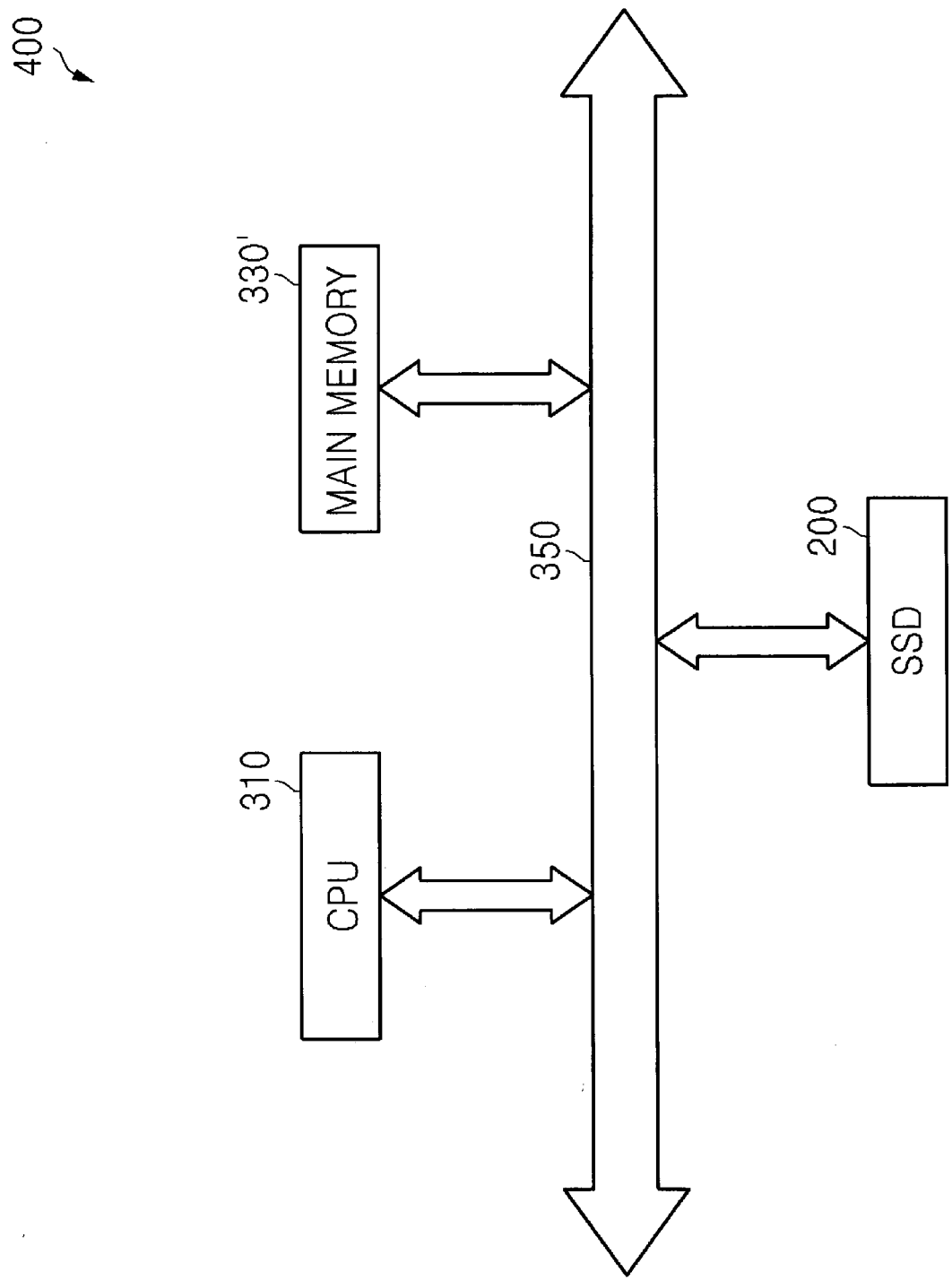
FIG. 7 is another block diagram of a computer system according to example embodiments of inventive concepts.

FIG. 7 is another block diagram of a computer system 400 according to example embodiments of inventive concepts. The computer system 400 includes the CPU 310, a main memory 330', and the SSD 200.

Unlike the computer system 300 illustrated in FIG. 6, the computer system 400 illustrated in FIG. 7 includes the SSD 200 implemented as a single block. The SSD 200 may include the controller 210, the non-volatile RAM 100, and the non-volatile memory array 220 as illustrated in FIG. 3. Since the SSD 200 has been described with reference to FIGS. 4 and 5, descriptions thereof will be omitted. The main memory 330' may include a separate controller (not shown).

FIGS. 6 and 7 merely illustrate examples of a computer system that utilizes the non-volatile RAM 100 as a cache memory or a buffer of an SSD, instead of an HDD, and example embodiments of inventive concepts are not restricted thereto. For instance, the non-volatile RAM 100 may be utilized as a storage device for storing data in a computer system.

As described above, according to example embodiments of inventive concepts, a non-volatile RAM executes a read command based on an external temperature and a time lapse since a program operation, thereby preventing or reducing an inaccurate data reading. In addition, an SSD including a flash memory uses the non-volatile RAM as a cache memory, thereby preventing deterioration of the program performance of a non-volatile memory array. Furthermore, a computer system uses the non-volatile RAM as a buffer for data output from a storage device such as a flash memory, thereby increasing system performance.

While inventive concepts have been particularly shown and described with reference to example embodiments thereof, it will be understood by those of ordinary skill in the art that various changes in forms and details may be made therein without departing from the spirit and scope of inventive concepts as defined by the following claims.

What is claimed is:

1. A non-volatile random access memory (RAM) comprising:
    a non-volatile RAM array;
    a buffer configured to buffer data to be programmed in the non-volatile RAM array and configured to buffer data read from the non-volatile RAM array; and
    a control block configured to read data from at least one of the non-volatile RAM array and the buffer based on whether the data to be read has been stored in the buffer, a temperature when the data was programmed, and a time lapse since the programming of the data.

2. The non-volatile RAM of claim 1, wherein the non-volatile RAM array is a phase-change random access memory (PRAM) array.

3. The non-volatile RAM of claim 1, wherein the buffer is one of static random access memory (SRAM) and dynamic random access memory (DRAM).

4. The non-volatile RAM of claim 1, wherein the control block is configured to read the data from the buffer when the data is stored in both the buffer and the non-volatile RAM array.

5. The non-volatile RAM of claim 4, wherein the control block is configured to read the data from the non-volatile RAM array based on whether a threshold time period corresponding to the temperature at the programming of the data has lapsed, when the data is stored in the non-volatile RAM array only.

6. The non-volatile RAM of claim 5, wherein the control block is configured to defer executing a read command until the threshold time period lapses, when the data is stored in the non-volatile RAM array only.

7. The non-volatile RAM of claim 6, wherein the control block is configured to read the data from the non-volatile RAM array after the threshold time period lapses, when the data is stored in the non-volatile RAM array only.

8. The non-volatile RAM of claim 5, wherein the control block is configured to read the data from the non-volatile RAM array after threshold time period lapses, when the data is stored in the non-volatile RAM array only.

9. The non-volatile RAM of claim 1, wherein the control block comprises:
    a cell information storage unit configured to store program information relating to position information of programmed data, the temperature when the data was programmed, and a time when the data was programmed;
    a time table configured to store a threshold time period for execution of a read command, which corresponds to the temperature when the data was programmed; and
    a controller configured to execute the read command based on the program information and whether the threshold time period has lapsed.

10. The non-volatile RAM of claim 9, wherein the control block further comprises:
    a timer configured to count time since the data is programmed.

11. The non-volatile RAM of claim 10, wherein the control block further comprises:
    a temperature sensor configured to measure the temperature when the data is programmed.

12. A solid state drive (SSD) comprising:
    a non-volatile memory array; and
    a non-volatile random access memory (RAM) configured to function as a cache memory for data fetched from the non-volatile memory array wherein,
    the non-volatile RAM includes,
    a non-volatile RAM array,
    a buffer configured to buffer data to be programmed in the non-volatile RAM array and configured to buffer data read from the non-volatile RAM array, and
    a control block configured to read data from at least one of the non-volatile RAM array and the buffer based on whether the data to be read has been stored in the buffer, a temperature when the data was programmed, and a time lapse since the programming of the data.

13. The SSD of claim 12, wherein the control block is configured to read the data from the buffer when the data is stored in both the buffer and the non-volatile RAM array.

14. The SSD of claim 13, wherein the control block is configured to read the data from the non-volatile RAM array based on whether a threshold time period corresponding to the temperature at the programming of the data has lapsed, when the data is stored in the non-volatile RAM array only.

15. The SSD of claim 14, wherein the control block is configured to defer executing a read command until the threshold time period lapses, when the data is stored in the non-volatile RAM array only.

16. The SSD of claim 15, wherein the control block is configured to read the data from the non-volatile RAM array after the threshold time period lapses, when the data is stored in the non-volatile RAM array only.

17. A computer system comprising:
    a non-volatile RAM configured to function as at least one of a buffer storage and a storage device wherein,
    the non-volatile RAM includes:
    a non-volatile RAM array,
    a buffer configured to buffer data to be programmed in the non-volatile RAM array and configured to buffer data read from the non-volatile RAM array; and
    a control block configured to read data from at least one of the non-volatile RAM array and the buffer based on whether the data to be read has been stored in the buffer, a temperature when the data was programmed, and a time lapse since the programming of the data.

18. The computer system of claim 17, wherein the control block is configured to read the data from the non-volatile RAM array based on whether a threshold time period corresponding to the temperature at the programming of the data has lapsed, when the data is stored in the non-volatile RAM array only.

19. The computer system of claim 18, wherein the control block is configured to defer executing a read command until the threshold time period lapses, when the data is stored in the non-volatile RAM array only.

20. The computer system of claim 19, wherein the control block is configured to read the data from the non-volatile RAM array after the threshold time period lapses, when the data is stored in the non-volatile RAM array only.

* * * * *